United States Patent
Co

(10) Patent No.: US 7,797,578 B2
(45) Date of Patent: *Sep. 14, 2010

(54) FAULT DIAGNOSIS OF SERIALLY-ADDRESSED MEMORY CHIPS ON A TEST ADAPTOR BOARD TO A MIDDLE MEMORY-MODULE SLOT ON A PC MOTHERBOARD

(75) Inventor: Ramon S. Co, Trabuco Canyon, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 378 days.

This patent is subject to a terminal disclaimer.

(21) Appl. No.: 12/101,138

(22) Filed: Apr. 10, 2008

(65) Prior Publication Data

US 2009/0217102 A1 Aug. 27, 2009

Related U.S. Application Data

(63) Continuation-in-part of application No. 12/036,985, filed on Feb. 25, 2008.

(51) Int. Cl.
*G06F 11/00* (2006.01)
(52) U.S. Cl. .................. 714/25; 714/42; 714/718
(58) Field of Classification Search ............... 714/25, 714/42, 718
See application file for complete search history.

(56) References Cited

U.S. PATENT DOCUMENTS

2006/0080473 A1* 4/2006 Wang et al. ............. 710/7

* cited by examiner

*Primary Examiner*—Scott T Baderman
*Assistant Examiner*—Jigar Patel
(74) *Attorney, Agent, or Firm*—Stuart T. Auvinen; g Patent LLC

(57) ABSTRACT

A standard memory module socket is removed from a target DRAM module slot on the component side and the test adaptor board connects to the target DRAM module slot on the reverse (solder) side of a personal computer motherboard, or an extender card may be used. The target DRAM module slot is a middle slot, such as the second or third of four DRAM module slots. The first and fourth DRAM module slots are populated with known good memory modules storing the BIOS at a high address and an operating system image and a test program at a low address. The test program accesses a memory chip in a test socket on a test adaptor board that is connected to the target DRAM module slot to locate defects. The motherboard does not crash since the BIOS, OS image, and test program are not stored in the memory chip under test.

20 Claims, 12 Drawing Sheets

PRIOR ART

FRONT SIDE

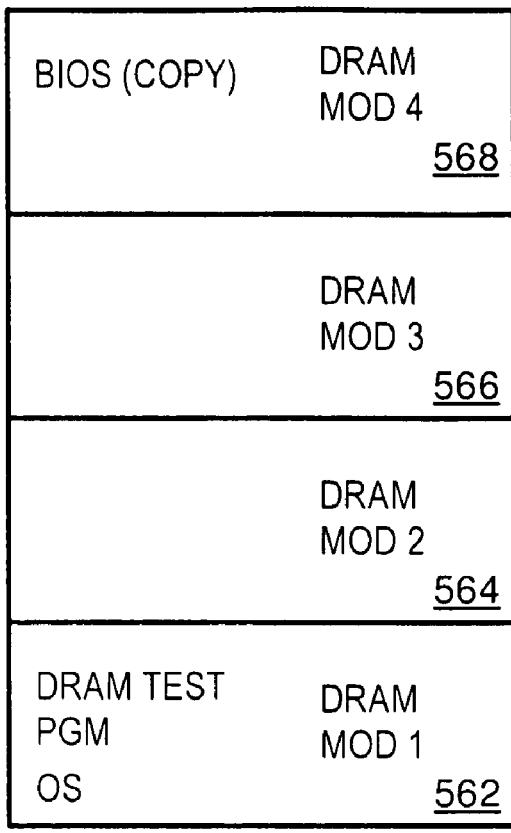
ALL 128 MEG DRAMS
FIG. 6A
FIG. 6B
INTERLEAVED DRAM - MOTHERBOARD CRASHES
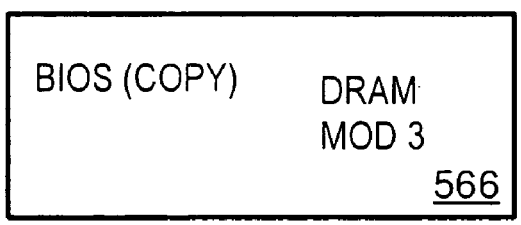 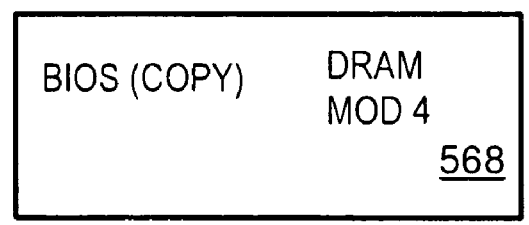
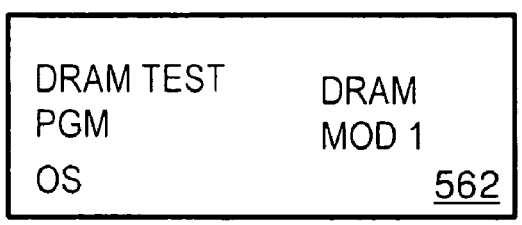 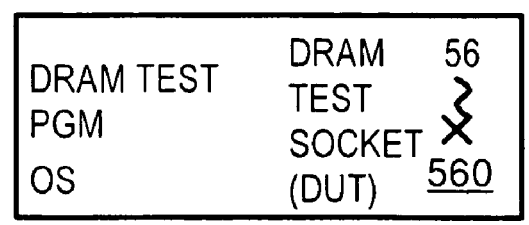

FIG. 14A
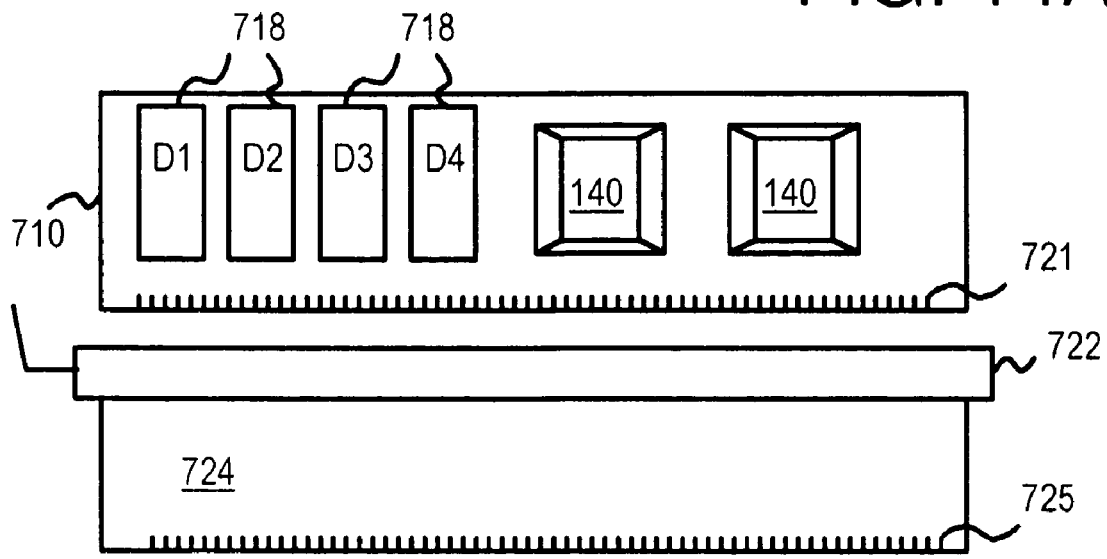
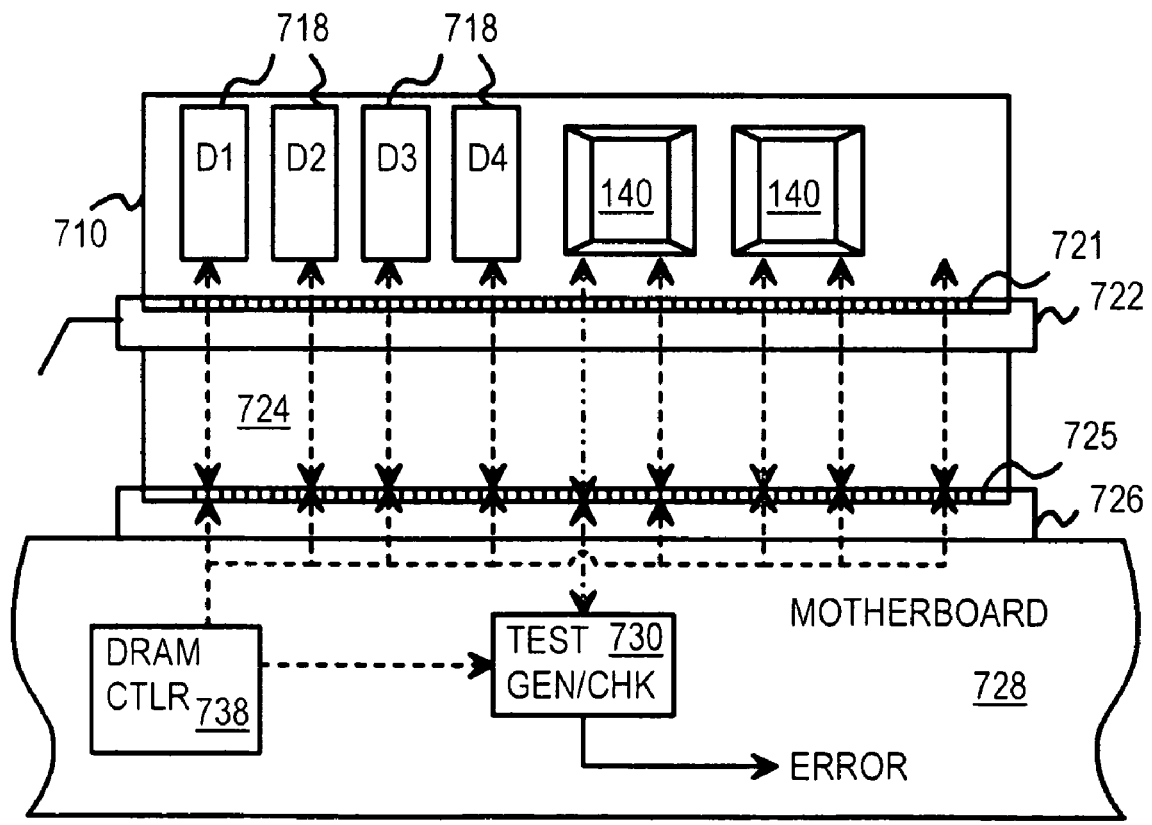
FIG. 14B

FAULT DIAGNOSIS OF SERIALLY-ADDRESSED MEMORY CHIPS ON A TEST ADAPTOR BOARD TO A MIDDLE MEMORY-MODULE SLOT ON A PC MOTHERBOARD

RELATED APPLICATIONS

This application is a Continuation-In-Part (CIP) of U.S. Ser. No. 12/036,985, filed Feb. 25, 2008, and may be related to U.S. Ser. Nos. 10/249,841, 11/309,296, 11/309,297, 11/309,298, 11/944,551, and U.S. Pat. Nos. 7,277,337, 7,272,774, having a common assignee and at least one inventor in common, but presenting patentably distinct claims.

FIELD OF THE INVENTION

This invention relates to memory-chip testers, and more particularly to personal-computer motherboard-based memory testers.

BACKGROUND OF THE INVENTION

A wide variety of electronic systems use memory chips such as dynamic-random-access memory (DRAM). DRAM chips are often soldered to small daughter-cards to form memory modules. Personal computers (PC's) use memory modules as the main memory on the PC motherboard. Memory modules are built to meet specifications set by industry standards, thus ensuring a wide potential market. High-volume production and competition have driven module costs down dramatically, benefiting buyers of a wide variety of electronic systems.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

FIG. 1 shows an illustration of a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 could be a fully-buffered dual-inline memory module (FB-DIMM) that is fully buffered by an Advanced Memory Buffer (AMB) chip (not shown) on memory module 10. The AMB chip uses differential signaling and packets to transfer data at high rates.

Memory modules without an AMB chip are still being made. Such unbuffered memory modules carry address, data, and control signals across metal contact pads 12 from the motherboard directly to DRAM chips 22. Some memory modules use simple buffers that buffer or latch some of these signals but do not use the more complex serial-packet interface of a FB-DIMM.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module.

A memory-module tester may be constructed from a personal computer PC motherboard. See for example U.S. Pat. Nos. 6,357,022, 6,351,827, and 6,742,144. However, individual DRAM chips are normally pre-tested before soldering to a memory module. Special chip-testing machines such as an automated-test-equipment (ATE) machine are often used for testing DRAM chips.

Since the memory module tester is constructed from an inexpensive PC motherboard, the cost of the tester is several orders of magnitude smaller than the cost of a million-dollar automated-test-equipment (ATE) machine. Thus test costs are significantly reduced by using a PC-motherboard-based tester.

DRAM chips may have a very large capacity, such as 512 Mbits, or half a giga-bit. The large number of memory cells, small size of individual memory cells, and overall large area of the DRAM die cause manufacturing defects to be somewhat common. DRAM chips are tested on a wafer before being separated and packaged, but this wafer-sort test may not catch all defects.

Thus some packaged DRAM chips are going to contain defects. Further testing of packaged DRAM chips may be performed cost-effectively at higher speeds, allowing defective DRAM chips to be identified and discarded. Manufacturers may build DRAM chips into memory modules, then perform testing on a low-cost memory module tester constructed from a PC motherboard.

FIG. 2 shows a memory map of a PC motherboard with a test socket for testing memory modules at a low address. The memory space of the microprocessor on a PC motherboard has the basic input-output system (BIOS) mapped to the highest addresses in the memory space. The BIOS code may be read from a read-only memory (ROM) and copied to a memory module inserted into DRAM module slot 566 during booting. Later in the boot process, an image of the operating system (OS) is loaded into the lowest addresses in the memory space, in DRAM module slot 562.

A special test program used by the memory module manufacturer can be loaded into the memory module in DRAM module slot 562 after booting. DRAM module slot 562 can have installed in it a memory chip under test that has been inserted into test socket 560 on a test adaptor board, rather than a memory module installed on the PC motherboard. However, when the memory chip under test is faulty, defect 56 may occur in the test program or in the OS image, causing the PC motherboard to crash. Ideally, defect 56 is not in the memory portion assigned to DRAM module slot 562 that contains the OS image, but in another portion tested by the test program in DRAM module slot 562. Then the test program may crash, or it may report the failure.

However, when defect 56 in the memory modules device under test occurs in the portion of DRAM module slot 562 that contains the OS image, the PC motherboard is likely to crash during booting or just after booting. This is less desirable, since the test program cannot report the location of the faulty memory. The test system can still detect the error by the motherboard crashing, and can discard the memory chip under test in test socket 560.

FIG. 3 shows a memory map of a PC motherboard with a test socket for testing memory modules at a high address. Rather than connect test socket 560 to low addresses of DRAM module slot 562, test socket 560 is connected to the terminals for DRAM module slot 566 on the motherboard. The memory chip under test then contains the highest memory addresses in the PC.

Since the BIOS is copied to DRAM module slot 566, the BIOS is copied to the memory chip under test. Should a faulty DRAM location occur where the BIOS is loaded, the PC motherboard may crash during booting before the test program is executed. This is undesirable since the exact location of defect 56 within the memory chip under test cannot be readily determined. However, the test system can still detect the error by the motherboard crashing, and can discard the memory chip under test in test socket 560.

It is often desirable to find the exact location of the defect within a memory module. For example, if the defect location is known, then the DRAM memory chip containing this defect can be removed from the memory module substrate, and a new DRAM chip can be soldered onto the memory module in a rework process. This rework process can save the defective memory module. Moreover, as a DRAM chip tester, it is important to determine which DRAM chip is failing among the DRAM chips in the memory module. Many DRAM chips can be tested at the same time within the memory module. The failing DRAM chip can be sorted as bad part and the passing DRAM chip as good part.

Diagnosis of faults may be desired during development, such as to determine the cause of the fault. Statistics may be generated of fault locations to determine if a certain part of the memory module design is weak. A re-design of the memory module may then improve manufacturing yields.

What is desired is a PC motherboard tester that can determine the location of a defect in a faulty memory module. A motherboard tester that does not crash when a faulty memory module is being tested is desirable. A motherboard tester that can isolate a faulty memory location using a test program is desirable. It is further desired to test individual DRAM chips on such a test system that is modified to accept individual DRAM chips on a test adaptor board.

BRIEF DESCRIPTION OF THE DRAWINGS

FIGS. 6A-B highlight a problem in testing memory chips when the BIOS configures the memory modules for interleaving.

FIGS. 14A-B show testing a memory chip at middle addresses using an extender card.

DETAILED DESCRIPTION

The present invention relates to an improvement in memory chip testers and diagnosis tools. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that diagnosis of memory module failures can be aided by placing the memory chip under test in the middle of the motherboard's address space. Two good memory modules are inserted into standard memory module sockets on the motherboard, while a third memory module socket is removed from the motherboard and the motherboard traces for this removed socket are instead connected to the test adaptor board. The memory chip under test inserted into the test socket on the test adaptor board then connects to the motherboard traces for this removed memory module socket. Other memory chips are permanently soldered to the test adaptor board to emulate a full-capacity memory module once the memory chip under test is inserted into the test socket.

The removed memory module socket is for a middle portion of the motherboard's address space. The BIOS at the high addresses is loaded into one of the good memory modules while the OS image and test program at the low addresses are loaded into the other one of the good memory modules inserted in the standard memory module sockets on the motherboard. Thus the BIOS, OS image, and test program are loaded into known good memory modules. The possibly faulty memory chip under test is mapped to the middle addresses in the address space that are not used for critical code that could crash the motherboard.

The motherboard can boot and execute the test program without crashing, even when the memory chip under test is faulty. The test program can isolate the faulty memory located within the memory chip under test and report this location to the tester system host or diagnosis equipment.

Figure 1:
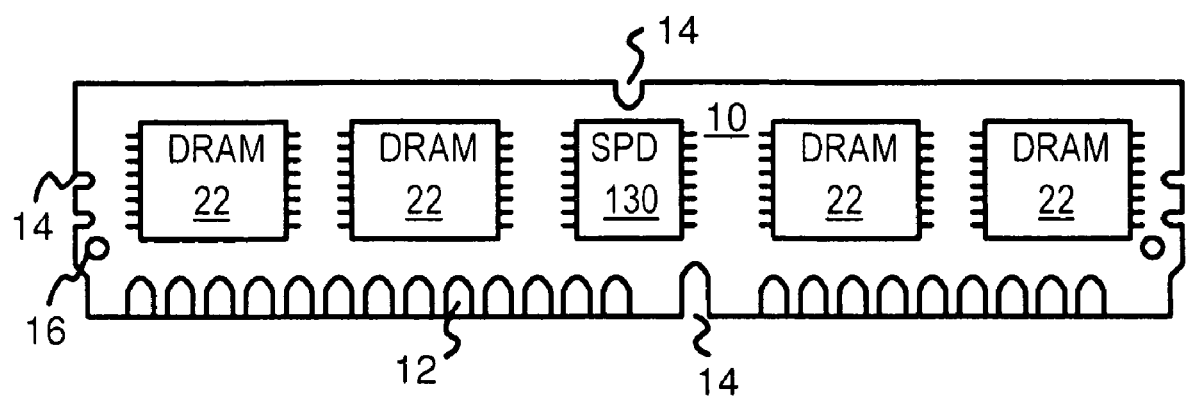
FIG. 1 shows an illustration of a fully-buffered memory module.
Figure 2:
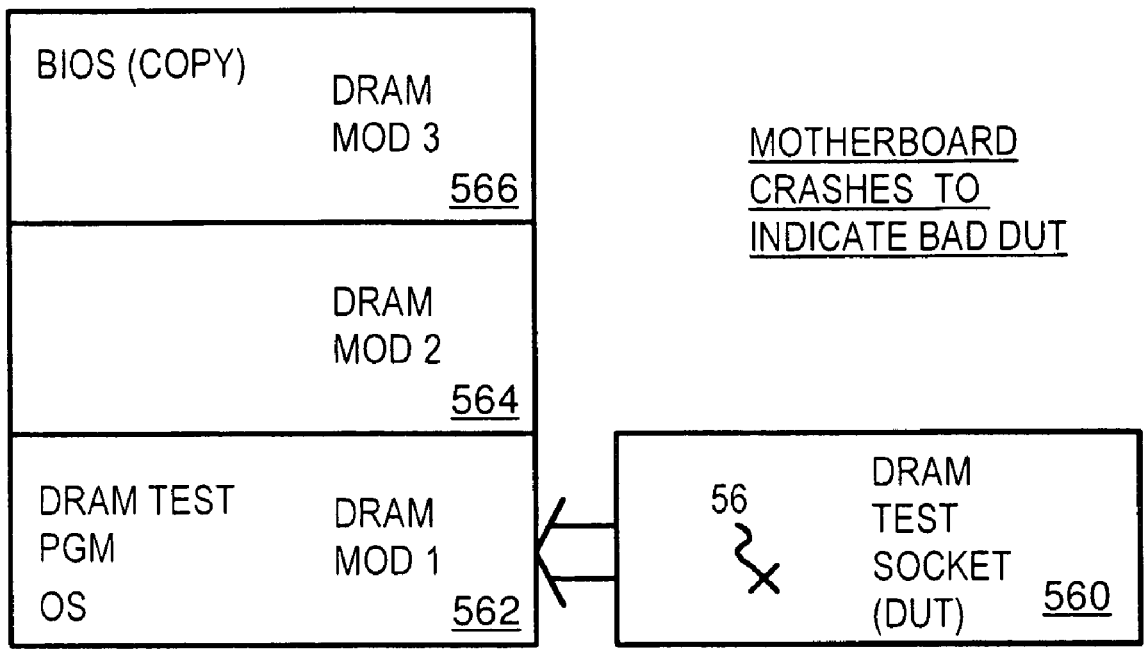
FIG. 2 shows a memory map of a PC motherboard with a test socket for testing memory modules at a low address.
Figure 3:
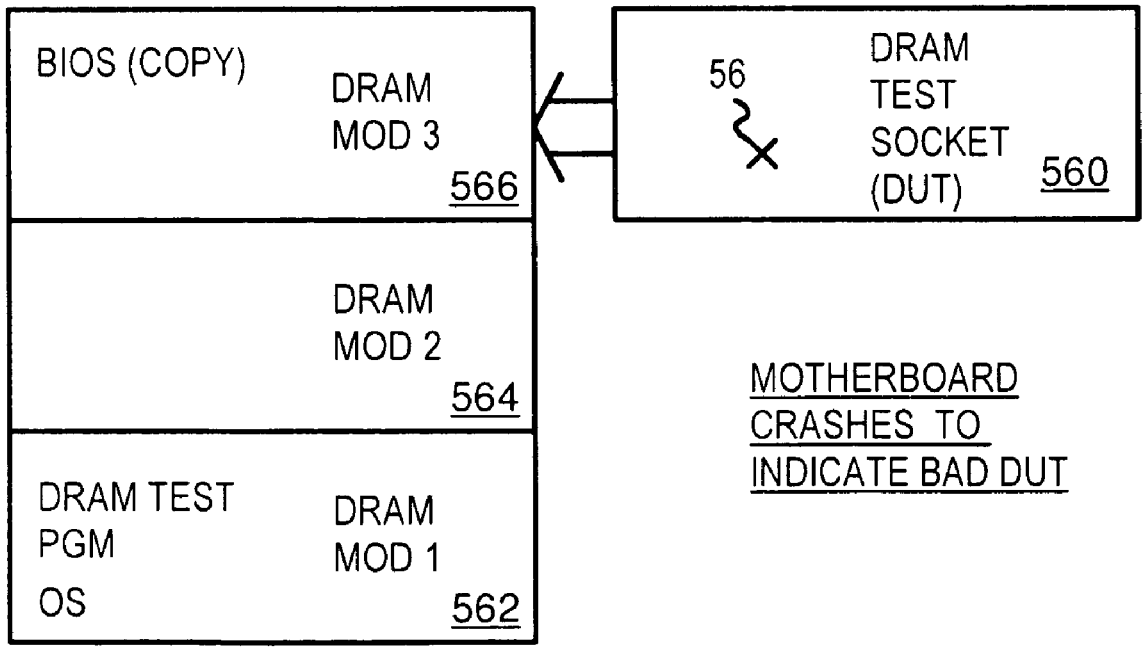
FIG. 3 shows a memory map of a PC motherboard with a test socket for testing memory modules at a high address.
Figure 4:
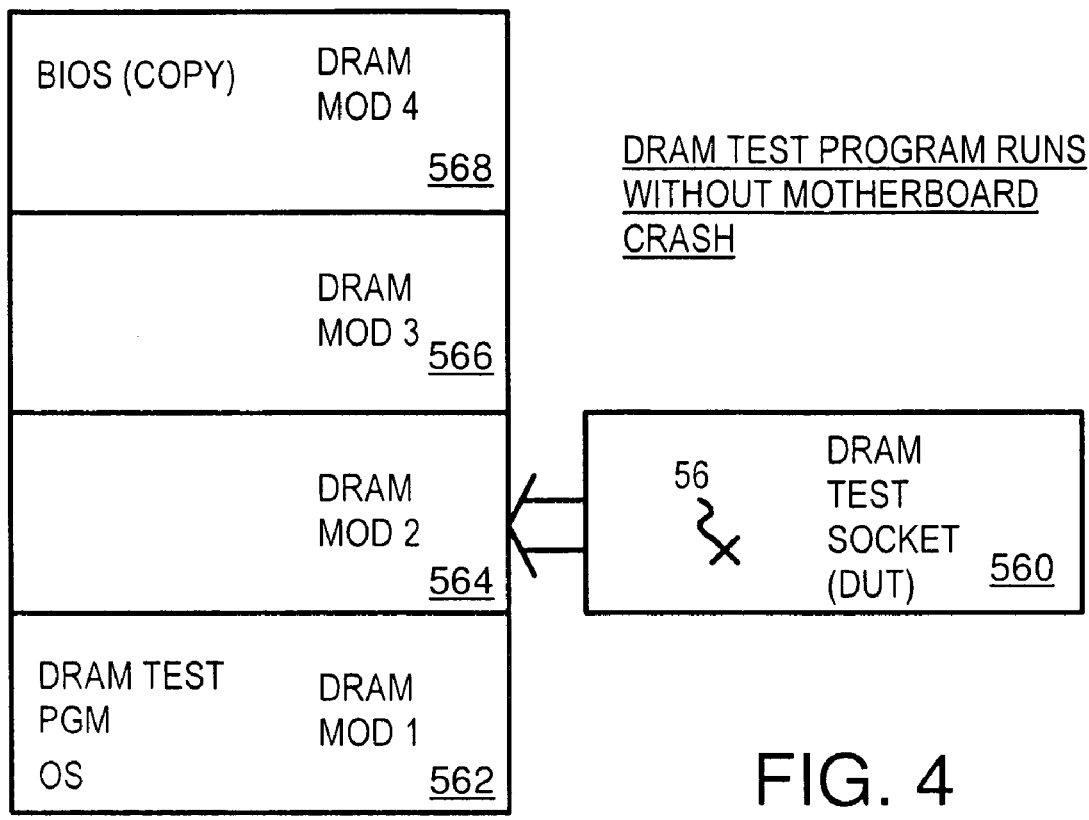
FIG. 4 shows a memory map of a PC motherboard with a test socket for testing a memory chip at a middle address in a second module location.

FIG. 4 shows a memory map of a PC motherboard with a test socket for testing a memory chip at a middle address in a second module location. The memory space of the microprocessor on a PC motherboard has the basic input-output system (BIOS) mapped to the highest addresses in the memory space.

The BIOS code may be read from a read-only memory (ROM) and copied to DRAM module slot 568 during booting. Later in the boot process, an image of the operating system (OS) is loaded into the lowest addresses in the memory space, in DRAM module slot 562.

A special test program used by the memory module manufacturer can be loaded into the memory module connected to DRAM module slot 562 after booting. DRAM module slot 564 can connect to a test adaptor board reverse-mounted to the solder-side of the motherboard, rather than a memory module installed into a standard memory module socket on the component side of the PC motherboard. A memory chip under test can be inserted into test socket 560 on the test adaptor board.

When the memory chip under test is faulty, the defect cannot occur in the test program or in the OS image, since these are stored in a known good memory module on the motherboard in DRAM module slot 562. The defect in the memory device under test cannot occur in the BIOS copy, since the BIOS copy at the high address is stored in another known good memory module on the motherboard in DRAM module slot 568.

Since the BIOS copy, the OS image, and the test program are stored in known good memory modules, defect 56 in the memory chip under test does not crash the motherboard. As long as good programming practices are followed for the test program, such as by having procedures in the test program to recover from an access to a faulty memory location in the memory chip under test, the motherboard is unlikely to crash. The test program can locate the defect and report the location to a user, such as through a test system host or diagnosis host. The test program can write and read all memory locations in the memory chip under test in test socket 560, which is connected to DRAM module slot 564.

The motherboard may contain three or four memory modules. When four modules are used, the third memory module location, DRAM module slot 566, may be populated with a known good memory module on a standard motherboard socket.

Figure 5:
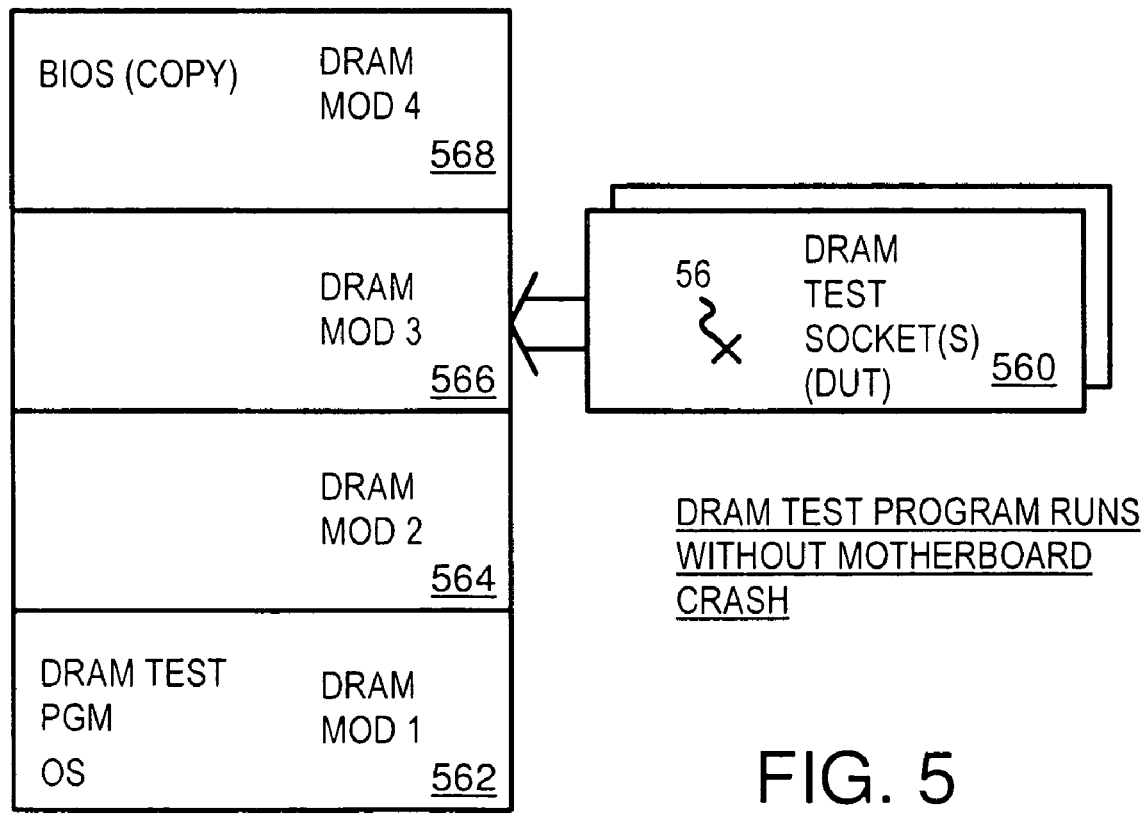
FIG. 5 shows a memory map of a PC motherboard with a test socket for testing a memory chip at another middle address in a third module location.

FIG. 5 shows a memory map of a PC motherboard with a test socket for testing a memory chip at another middle address in a third module location. In this alternative, the motherboard contains four memory-module socket locations: DRAM module slots 562, 564, 566, 568. All four slots are populated during testing. Known good memory modules are inserted into standard memory module sockets on the component side of the motherboard for DRAM module slots 562, 564, 568. Test socket 560 is connected through the test adaptor board to motherboard traces of third DRAM module slot 566.

Since the BIOS copy, the OS image, and the test program are stored in known good memory modules, inserted into first DRAM module slot 562 and into fourth DRAM module slot 568, defect 56 in the memory chip under test does not crash the motherboard. The test program code is read from the memory module inserted into first DRAM module slot 562, and writes and reads memory locations in the memory chip under test inserted into test socket 560, which is connected to third DRAM module slot 566. When defect 56 is located, the test program can record its exact location, and report the addresses of all defects to the host or user.

Test socket 560 may include more than one memory chip test socket. Test socket 560 could contain two sockets, each for one memory chip under test. Test socket 560 could connect to two module locations on the motherboard, such as to both DRAM module slot 564 and to DRAM module slot 566, or just to one module location.

BIOS Routines Configure DRAM Slots

During booting of the motherboard, the BIOS executes a series of routines before or after the BIOS is copied to high addresses in DRAM. The BIOS typically is stored in flash memory that can be updated with a hardware configuration of the motherboard. This hardware configuration may include information about the DRAM installed in the slots that was saved during a previous time that the motherboard was running.

Some BIOS routines perform a memory test. The BIOS may write a value to a memory address and then read that address to see if the data was retained. If the data matches, the BIOS assumes that DRAM is present at that address.

The BIOS may have a table of possible memory configurations. For example, the memory-configuration table may have one entry for when only the first slot is populated with a 1 G DRAM, another entry for when two slots are populated with 1 G DRAMs, another entry for when three slots are populated with 1 G DRAMs, etc. Some entries may be for mixed configurations, such as 1 G in slot 1, 512M in slot 2, 4 G in slot 3, 4 G in slot 4. This table of allowable memory configurations is usually included in a help file or other documentation for the BIOS or motherboard.

The BIOS may automatically test a series of memory addresses during booting, and pick one entry in the memory-configuration table as the current configuration based on the results of the memory test. This auto-test feature may be disabled by running a BIOS setup program and disabling the feature. The BIOS setup program is usually available by pressing a certain key during booting, such as F5 or holding down the spacebar key on the PC keyboard. A message may appear on the display screen during booting telling the user what key to press to enter the BIOS setup program.

The BIOS may also determine the current memory configuration by reading SPD-EEPROM 130 on each memory module. Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module. The BIOS can read SPD-EEPROM 130 for each of the four memory modules in DRAM module slots 562, 564, 566, 568 and find an entry in the memory-configuration table that matches the data read from SPD-EEPROMs 130. When the memory auto-test feature is disabled, the BIOS uses this alternate method to configure the memory. A third alternative is to just use the last memory configuration before the motherboard was rebooted.

Disabling the memory auto-test feature in BIOS forces the BIOS to load the OS image into the first memory module, in first DRAM module slot 562. This is desirable, since it prevents the memory chip under test in the second or third slots from being used as low addresses to store the OS image.

Interleaved DRAM Problem—FIGS. 6A-B

FIGS. 6A-B highlight a problem in testing memory chips when the BIOS configures the memory modules for interleaving. When all four DRAM module slots 562, 564, 566, 568 are populated with the same size of memory module, including the test adaptor board with the memory chip under test inserted into test socket 560, the BIOS may chose an entry in its memory-configuration table that interleaves addresses among two or four memory modules.

In FIG. 6A, all four memory modules have the same size, using 128 M-bit DRAM chips. For memory modules with 8 such chips, the module capacity is 128 MB. The memory chip under test, inserted into test socket 560, is also for a 128 MB memory module, so all four memory modules are the same size, 128 MB.

Rather than serially address the four memory modules, with test socket 560 being accessed as a middle address, the BIOS may choose an interleaved memory configuration. For 2-way interleaved memory configurations, addresses alternate between 2 memory modules. For example, addresses from 0 to 4K–1 may be routed to first DRAM module slot 562, while addresses from 4K to 8K–1 may be routed to second DRAM module slot 564. Successive 4K blocks (DRAM pages) are alternately accessed from alternate slots in a ping-pong fashion. Other page-interleave sizes are possible, such as 8K, 2K, 1K, etc. or word-interleaving may be used.

Interleaved memory configurations are preferred for their higher bandwidth, since DRAM delays such as due to row precharging can be hidden by overlap with access to a second memory module. Thus the BIOS may choose either 2-way or 4-way interleaved configurations when the memory chip under test matches the size of another installed memory module.

In FIG. 6B, the BIOS chooses an interleaved memory configuration. Since all four memory modules have the same size, 128 MB, the BIOS chooses a dual 2-way interleave configuration. The known good memory modules inserted into third and fourth DRAM module slots 566, 568 are interleaved together, so that the copy of the BIOS is stored in both memory modules. Likewise, the known good memory module in first DRAM module slot 562 is interleaved with the test adaptor board with the memory chip under test inserted into test socket 560 for second DRAM module slot 564. Thus the OS image and the test program are stored in both the known good memory module in first DRAM module slot 562, and in the memory chip under test in second DRAM module slot 564.

When the memory chip under test contains defect 56, and this defect occurs in a portion of memory storing an interleave of the OS image or the test program, the motherboard may crash. The location of defect 56 may not be found by the test program, preventing full diagnosis. This is undesirable.

Figure 7:
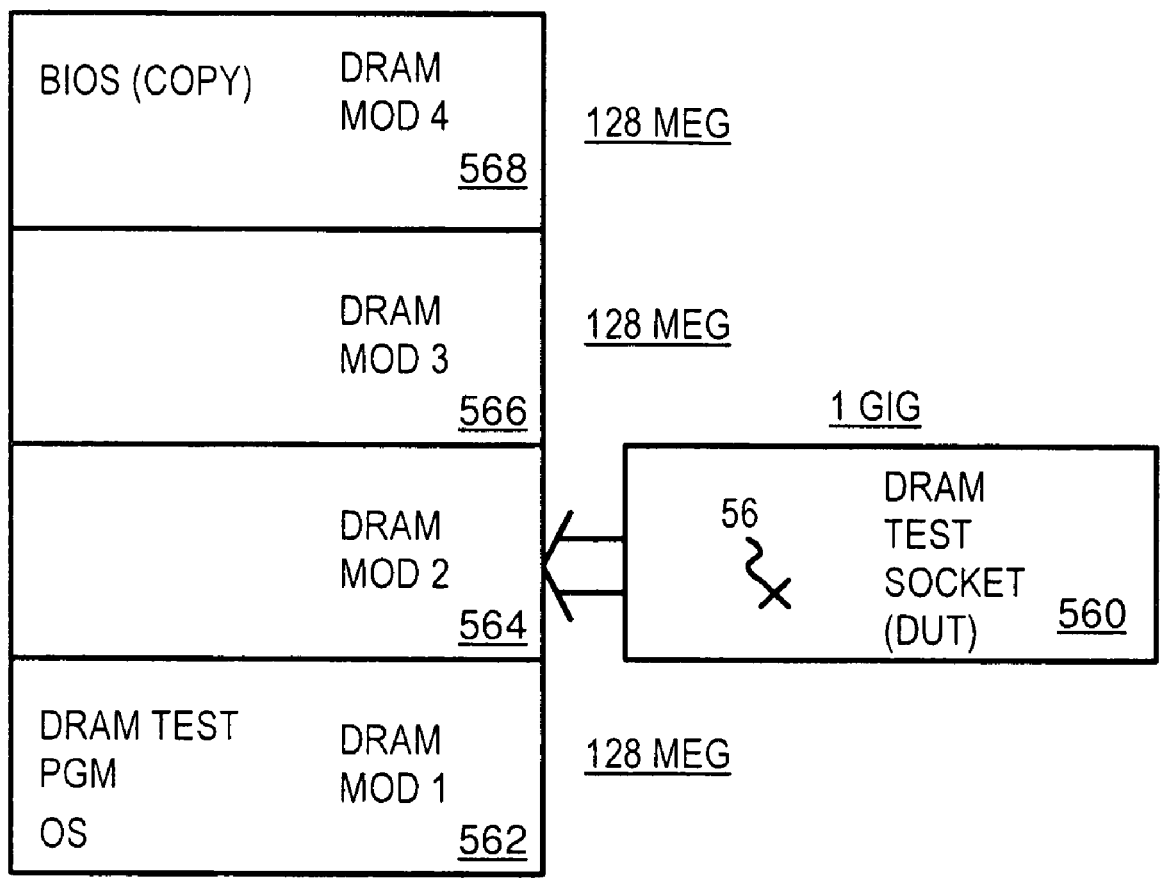
FIG. 7 shows a non-homogenous memory space that avoids the interleaving problem of FIG. 6B.

FIG. 7 shows a non-homogenous memory space that avoids the interleaving problem of FIG. 6B. Rather than use a test adaptor board carrying test socket 560 that corresponds to the same size of memory module as the known good memory modules in DRAM module slots 562, 566, 568, a different memory module size is used for the test adaptor board carrying the memory chip under test.

The known good memory modules in DRAM module slots 562, 566, 568 are each 128 MB modules, while the test adaptor board with the memory chip under test inserted into test socket 560 that occupies second DRAM module slot 564 emulates a 1 GB module. Since the size of the test adaptor board's total memory mismatches the other memory module sizes, the BIOS cannot choose an interleaved memory configuration that interleaves the memory chip under test.

The BIOS may still interleave the third and fourth known-good memory modules installed in DRAM module slots 566, 568, but it cannot interleave the memory chip under test in second DRAM module slot 564 with the known good memory module in first DRAM module slot 562. Thus the OS image and the test program are stored only in the known good memory module, not in the memory chip under test. The test program can execute without crashing, allowing the location of defect 56 to be found and reported to the host or user.

The user must not insert a 128 MB memory module test adaptor board into test socket 560. However, all other memory module sizes are acceptable. The user could be warned not to test 128 MB memory modules, such as by the host test-system software or diagnosis software. When DRAM chips for 128 MB memory modules need to be tested, different known-good memory modules could be installed, such as 512 MB memory modules. Alternately, several motherboards could be available with different sizes of known good memory modules, and the user or robotic handler could route memory chips under test to the correct motherboard for testing.

Rather than use an expensive general-purpose I.C. tester, inexpensive testers based on PC motherboards have been developed. These motherboard-based testers cost only about $10K yet can replace a quarter-million-dollar I.C. tester when testing memory chips or modules. The memory chip to be tested is inserted into a test socket on a test adaptor board (daughter card) mounted on the back-side of the motherboard. The invention described herein can be used with motherboards in such test systems by connecting the test adaptor board to a slot being used for a middle address, and ensuring that it is not interleaved.

Figure 8:
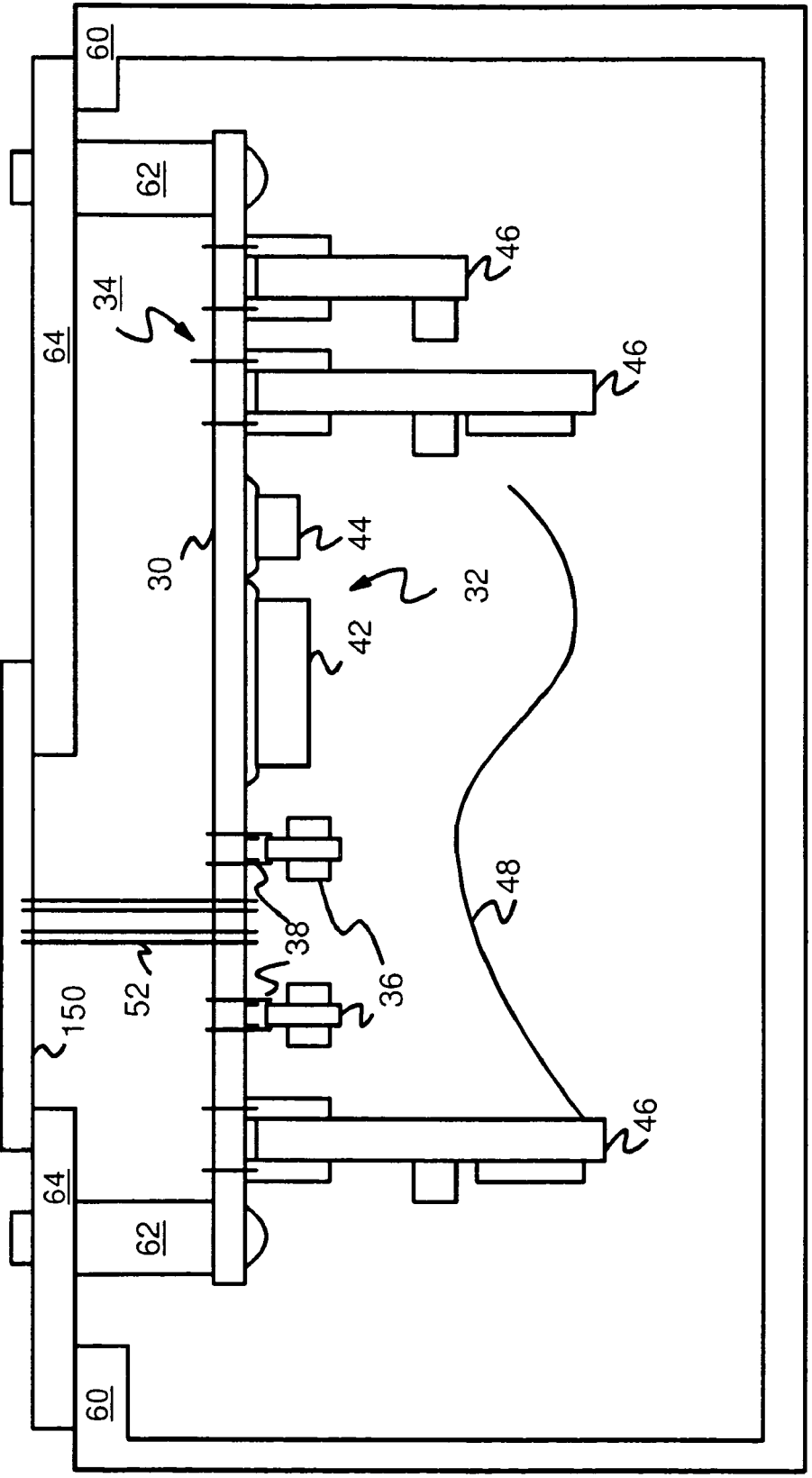
FIG. 8 illustrates the test adaptor board and motherboard mounted in a chassis to a removable metal plate.

FIG. 8 illustrates the test adaptor board and motherboard mounted in a chassis to a removable metal plate. A conventional PC motherboard is mounted upside-down within chassis 60. Rather than connect motherboard substrate 30 directly to chassis 60, motherboard substrate 30 is mounted to metal plate 64 by standoffs 62. Motherboard substrate 30 is not mounted directly to chassis 60 in this embodiment, although it could be in some embodiments.

Test adaptor board 150 is mounted to metal plate 64. Chip test socket 140 is mounted to wiring traces on the top of test adaptor board 150, while pins 52 provide electrical connection from wiring traces on test adaptor board 150 to motherboard substrate 30. DRAM chip 100 being tested is inserted into chip test socket 140. Additional memory chips 102 on test adaptor board 150 may also be tested by the test program, but are assumed to be good parts that don't cause the test program to fail.

Motherboard substrate 30 together with test adaptor board 150 can be quickly removed from chassis 60 by lifting metal plate 64 up and out of chassis 60. Screws, bolts, or clamps (not shown) can be used to secure metal plate 64 to chassis 60. These screws can be quickly removed by a technician when the motherboard/test board assembly needs to be replaced. This allows the tester to continue operating with a replacement motherboard/test adaptor board assembly with minimum downtime. Metal plate 64 normally has a larger area than does motherboard substrate 30 so that metal plate 64 has an overhang that can be used to mount it to chassis 60.

Motherboard substrate 30 has components 42, 44 mounted on component-side 32 of substrate 30. Memory modules 36 fit into memory module sockets 38. Memory module sockets 38 have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm or handler inserting DRAM chip 100 into chip test socket 140 since cables 48 and expansion cards 46 are mounted below substrate 30, while chip test socket 140 is mounted above substrate 30. Cables 48 and expansion cards 46 are kept out of the way inside chassis 60.

Adaptor pins 52 are soldered into through-holes in adaptor board 150 and into holes in substrate 30. Adaptor pins 52 are arranged to have the same arrangement and spacing as the substrate-mounting pins for memory module sockets 38. One or more of memory module sockets 38 has been removed from the component side of the PC motherboard, leaving the through-holes. Adaptor pins 52 are then fitted through the exposed through holes for the removed memory module socket. Rather than push the pins through from component-side 32, adaptor pins 52 are pushed through from solder-side 34 to component-side 32.

Figure 9:
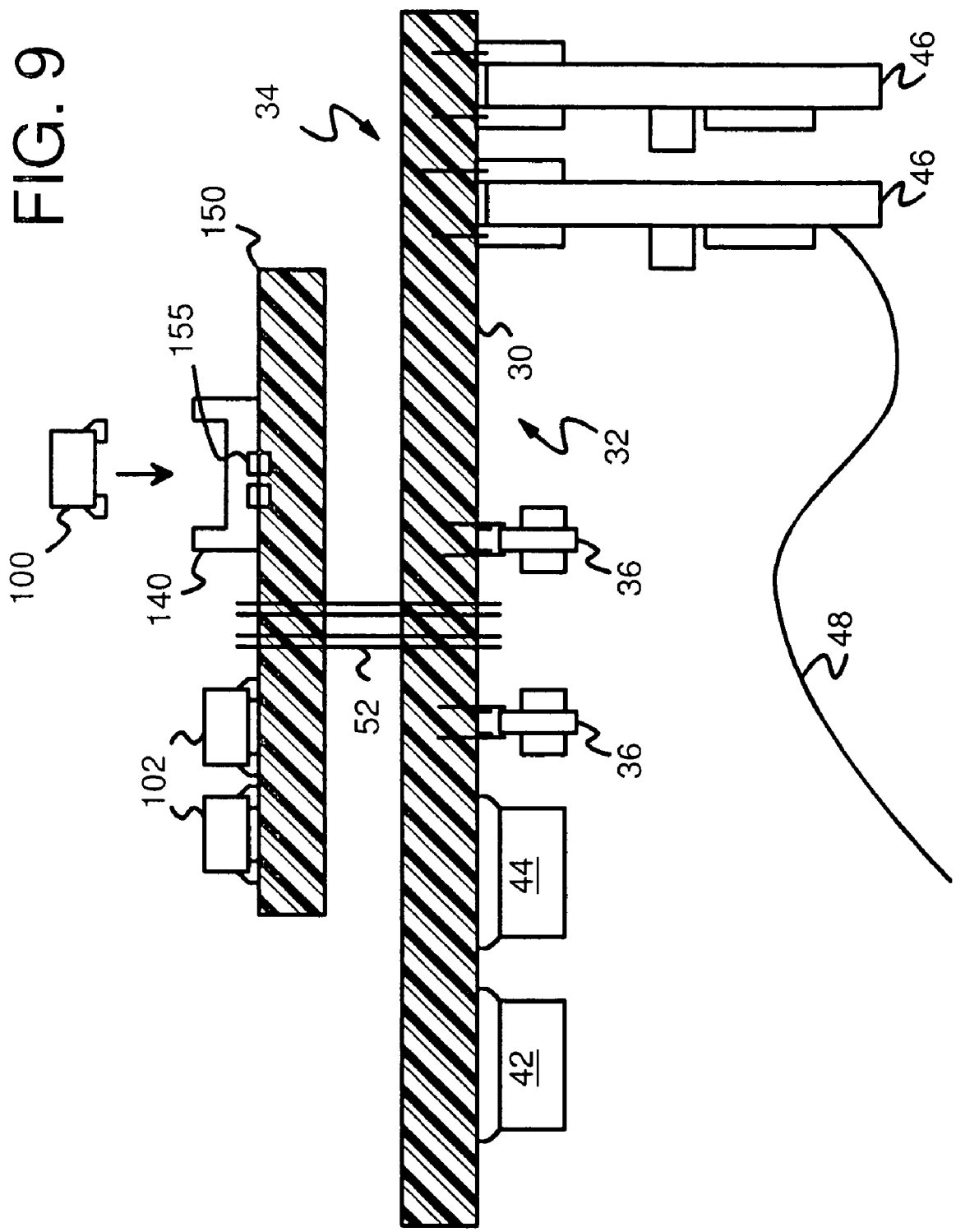
FIG. 9 is a cross-section of a DRAM-chip test adaptor board reverse mounted to a PC motherboard.

FIG. 9 is a cross-section of a DRAM-chip test adaptor board reverse mounted to a PC motherboard. Substrate 30 is a motherboard for a personal computer (PC) that is inverted in this figure so that the topside of substrate 30 is facing downward. Components 42, 44, mounted on the top side of substrate 30, include ICs such as a microprocessor, logic chips, memory controllers, buffers, and peripheral controllers. Sockets for expansion cards (not shown) are also mounted onto the top or component side of substrate 30.

Memory modules 36 are memory modules that fit into memory-module sockets. Memory module sockets have metal pins that fit through holes in substrate 30. These pins are soldered to solder-side 34 (facing upward in FIG. 9) of substrate 30 to rigidly attach the memory module sockets to the PC motherboard. Both electrical connection and mechanical support are provided by memory module sockets.

Cables 48 and expansion cards 46 obstruct access to memory modules 36. A robotic arm would be unable to insert and remove memory modules (or chips) from the module sockets (or chip sockets) on the component side of substrate 30 due to the obstruction of cables 48 and expansion cards 46.

Test adaptor board 150 is a small epoxy-glass circuit board designed to allow an automated handler, a person, or a robotic arm easy access to chip test socket 140 that is mounted on adaptor board 150. Test socket 140 on one surface of test adaptor board 150 mates with the pins or leads of DRAM chip 100, the device-under-test. Chip test socket 140 is soldered to wiring traces on test adaptor board 150 at socket pads 155.

The other surface of adaptor board 150 has adaptor pins 52 protruding through. These adaptor pins are soldered into through-holes in adaptor board 150. Adaptor pins 52 are arranged to have the same arrangement and spacing as the substrate-mounting pins for memory module sockets that hold memory modules 36 on PC motherboard substrate 30.

One or more of the memory module sockets has been removed from the component side of the PC motherboard, leaving the through-holes. The removed memory module socket is for a middle slot so that DRAM chip 100 being tested holds a middle portion of the memory space that does not store the test program, OS, BIOS, or other important system components. Adaptor pins 52 are then fitted through the exposed through holes for the removed memory module socket. Rather than push the pins through from component-side 32 of motherboard substrate 30, adaptor pins 52 are pushed through from solder-side 34 to component-side 32. Adaptor pins 52 are then soldered to substrate 30.

Test adaptor board 150 provides electrical connection and interfaces between the memory module socket pins and the pins of DRAM chip 100 being tested. For unbuffered memory modules, address and data lines from the memory module socket pins can be routed to pins in chip test socket 140 that mate with pins of DRAM chip 100. However, when the PC motherboard supports buffered memory modules such as FB-DIMM, test adaptor board 150 also contains buffer chips that interface to the motherboard and to DRAM chip 100. For example, an Advanced Memory Buffer (AMB) chip may be mounted on test adaptor board 150 to convert serial packets from the motherboard substrate 30 to parallel data and other control signals such as RAS and CAS to access DRAM chip 100.

Test adaptor board 150 provides a slight vertical spacing or offset from solder-side 34 surface of substrate 30, allowing a handler, person, or robotic arm to easily reach chip test socket 140 and plug DRAM chip 100 under test directly into chip test socket 140 on adaptor board 150. Since the offset of adaptor board 150 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 of substrate 30 allows close mounting of chip test socket 140 to the PC motherboard.

Since a memory module usually has several memory chips, additional memory chips 102 may be mounted to a surface of test adaptor board 150. Additional memory chips 102 may be additional DRAM memory chips so that the full data width of memory may be provided by test adaptor board 150 as would be provided by memory modules 36. Additional memory chips 102 could also include buffer chips such as registers for a registered memory module, or an Advanced Memory Buffer (AMB) when memory modules 36 are FB-DIMMs. Thus test adaptor board 150 mimics the same kind of memory module as memory modules 36 inserted into sockets on PC motherboard substrate 30.

Figure 10:
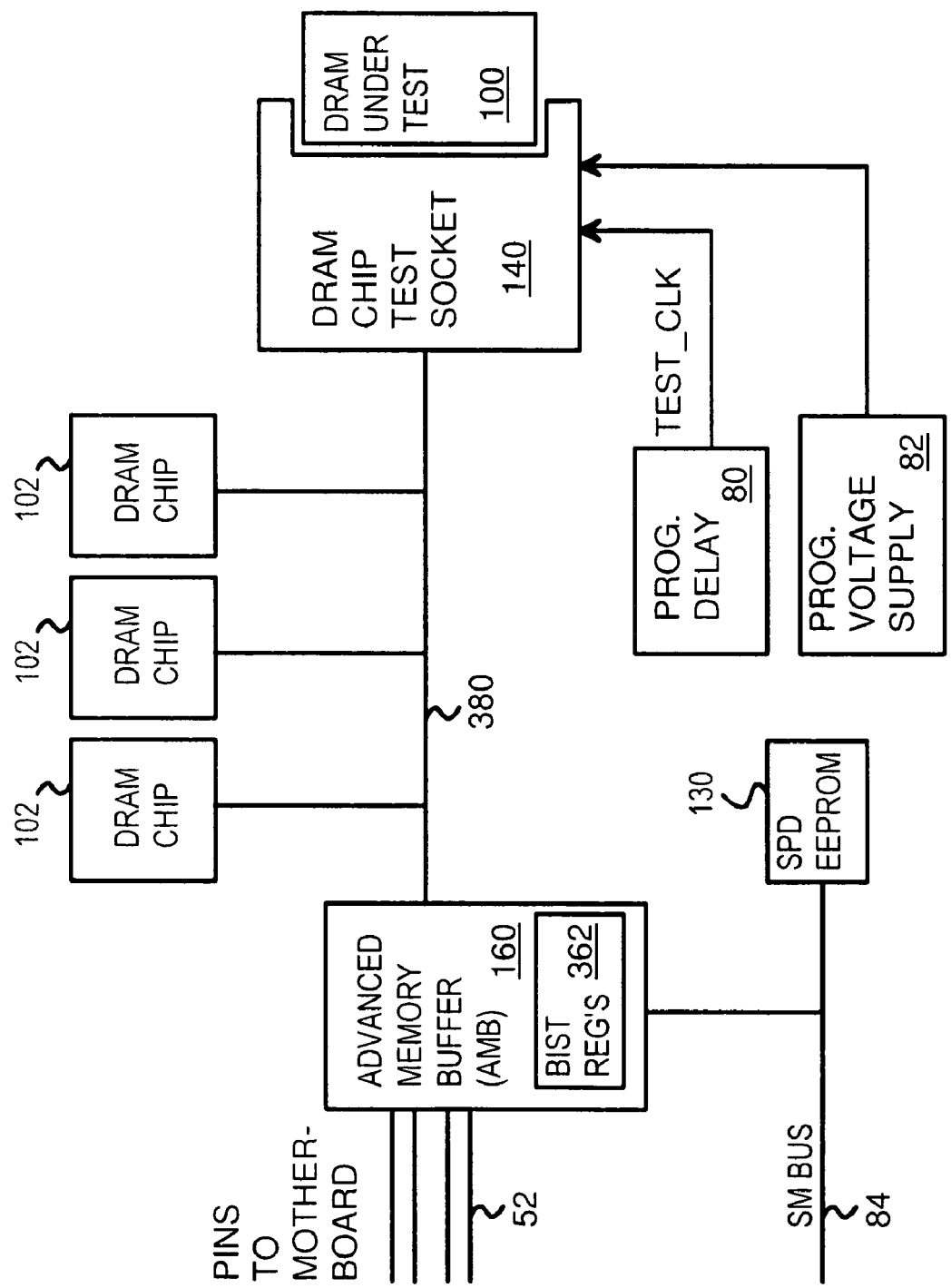
FIG. 10 is a block diagram of a fully-buffered test adaptor board for testing DRAM chips in a middle portion of the address space through a memory module socket on a PC motherboard.

FIG. 10 is a block diagram of a fully-buffered test adaptor board for testing DRAM chips in a middle portion of the address space through a memory module socket on a PC motherboard. Serial packets from the motherboard are carried over adaptor pins 52 to test adaptor board 150. AMB 160 contains a serial packet interface that reads commands, data, and addresses from these packets and generates memory control signals such as RAS and CAS to read and write data from memory chips 102. Address and data are buffered and driven in parallel to additional memory chips 102 over internal memory bus 380.

DRAM chip 100 under test is also connected to internal memory bus 380 through chip test socket 140. The specified data width of the memory module may require several additional memory chips 102 beyond DRAM chip 100 in chip test socket 140. For example, a data width of 128 bits would require 15 additional memory chips 102 when DRAM chip 100 and additional memory chips 102 have 8 data I/O bits.

DRAM chip 100 could be tested by the processor on the motherboard explicitly writing and reading all memory locations in DRAM chip 100. Another way to test DRAM chip 100 is to use built-in-self-test (BIST) circuitry in AMB 160. BIST registers 362 can be programmed to activate a BIST controller in AMB 160 that tests memory on internal memory bus 380. The result of the memory test can be written back to BIST registers 362 by the BIST controller to indicate a pass or a fail. The processor can thus test DRAM chip 100 by writing to BIST registers 362, activating the BIST controller, and reading the test result from BIST registers 362 after testing is complete.

Using BIST in AMB 160 is a very powerful way to test DRAM chip 100. Writing test programs is greatly simplified, since a few commands to write and read BIST registers 362 can replace thousands of test vectors. Test development costs can be greatly reduced. Using BIST in AMB 160 can be used in conjunction with locating DRAM chip 100 in a middle portion of the address space to reduce crashes during testing.

BIST register 362 may be read and written over system management SM bus 84 rather than by packets over adaptor pins 52. SM bus 84 is a serial bus used to read programming information from serial-presence detect electrically-erasable programmable read-only memory SPD-EEPROM 130. SPD-EEPROM 130 stores configuration information about the memory module emulated by test adaptor board 150, such as memory capacity, speed, CAS latency, data I/O width, manufacturer. SPD-EEPROM 130 is programmed by the memory module manufacturer and read at boot up by the personal computer to configure the PC's memory.

Margin testing can be performed by adjusting the power-supply voltage applied to DRAM chip 100 in chip test socket 140. Programmable voltage supply 82 can be programmed to adjust the power supply voltage for the device under test, such as for a minimum or maximum specified Vcc. Margins can be further tested by intentionally adding delays to signals. Programmable delay 80 can delay the clock or other signals such as RAS or CAS to DRAM chip 100. Margin testing can ensure that DRAM chip 100 has passed tests with an additional safety margin. Margin-tested parts may be more valuable for certain critical applications such as memory in critical servers.

Figure 11:
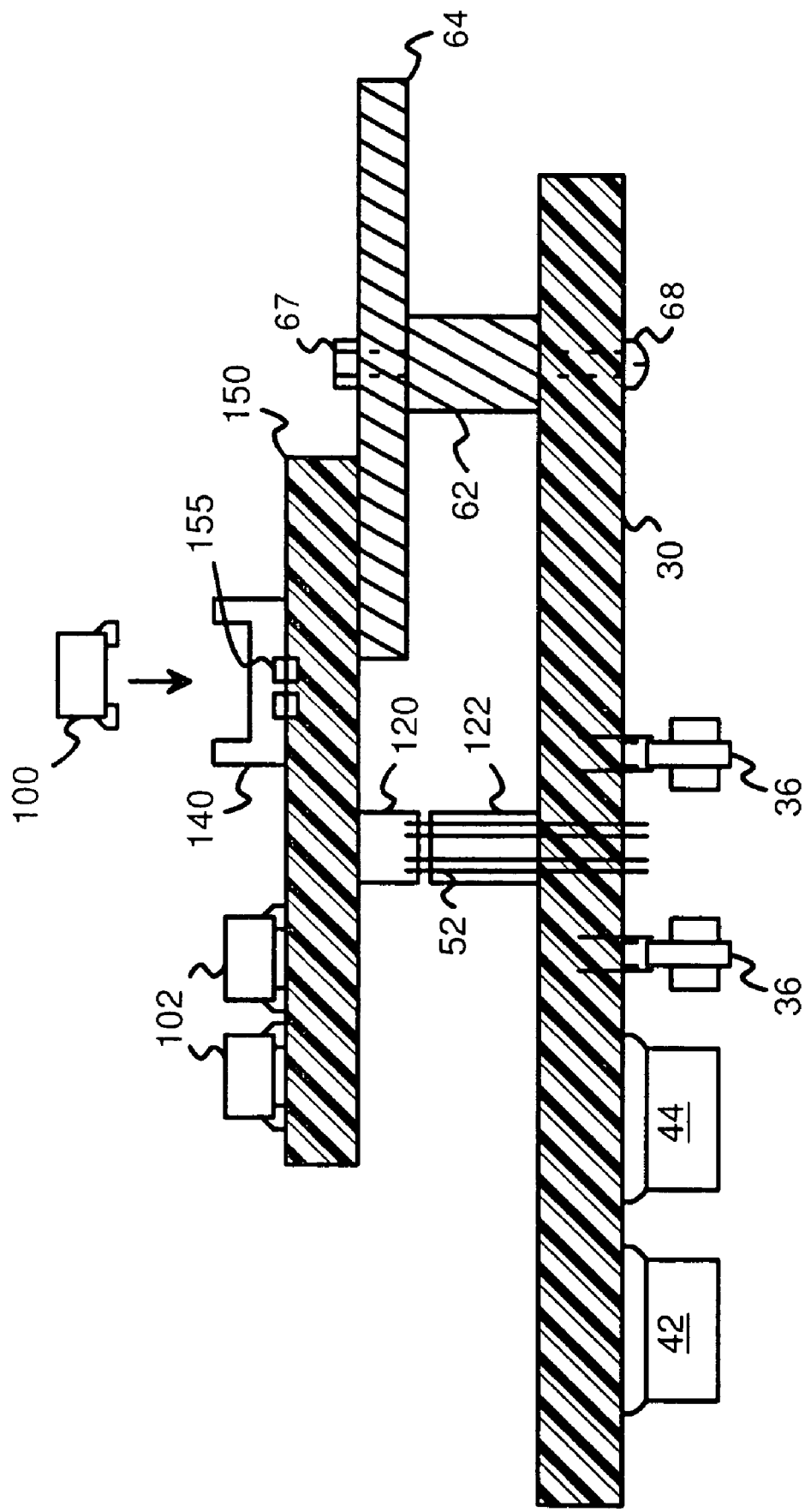
FIG. 11 is a cross-section of a DRAM-chip test adaptor board reverse mounted to a PC motherboard using a connector plug and supported by a metal plate.

FIG. 11 is a cross-section of a DRAM-chip test adaptor board reverse mounted to a PC motherboard using a connector plug and supported by a metal plate. Rather than have adaptor pins 52 fit through test adaptor board 150, connector 120 is soldered to the bottom surface of adaptor board 150. Connector 120 mates with connector 122 that is mounted to the solder-side of motherboard substrate 30, at or near the location of the removed memory module socket. Adaptor pins 52 may protrude through connector 122 and mate with holes in connector 120 as shown, or adaptor pins 52 may be deleted and replaced by metal contact pads in connectors 120, 122. A wide variety of connector types may be used, such as high-speed connectors, RJ-45 connectors, parallel-port connectors, and USB connectors. Some trademarked connectors are Q-Strip, Q-Pairs, Q2-Shielded (from Samtec) which are designed for operation in the GHz range and are mountable to circuit boards.

Connectors 120, 122 can be high-speed connectors, and may include grounded shielding that surrounds the high-speed signals within the connector to minimize reflections and signal distortion. Connectors 120, 122 facilitate quick removal of test adaptor board 150 from motherboard substrate 30, allowing for replacement of a faulty chip test socket 140 by simply unplugging connector 120 from connector 122 and replacing with a new test adaptor board 150. This is especially useful for parallel testers that have many PC motherboards with many test adaptor boards 150, since downtime is minimized.

Metal plate 64 rigidly supports test adaptor board 150. A metal chassis with an opening sized for test adaptor board 150 could act as metal plate 64 and provide support on all four sides of test adaptor board 150, rather than just the one side shown in this figure. Metal plate 64 is held to motherboard substrate 30 by standoff 62. Motherboards are often mounted to a metal chassis such as a PC enclosure by such standoffs, which may act as thick washers. Standoff 62 is a metal cylinder that has bolt 68 passing through its center. Bolt 68 passes through a hole in motherboard substrate 30, through standoff 62, and metal plate 64, and is held in place by nut 67. The hole through metal plate 64 may also be threaded, eliminating the need for nut 67.

Components 42, 44, mounted on component-side 32 of substrate 30, include ICs such as a microprocessor, logic chips, memory controllers, buffers, and peripheral controllers. Memory modules 36 are memory modules that fit into memory-module sockets. Memory module sockets have metal pins that fit through holes in substrate 30. These pins are soldered to the solder-side of substrate 30.

Test adaptor board 150 provides a slight vertical spacing or offset from the solder-side surface of substrate 30, allowing a handler, person, or robotic arm to easily reach chip test socket 140 and plug DRAM chip 100 under test directly into chip test socket 140 on adaptor board 150. The relatively flat surface of the solder-side of substrate 30 allows close mounting of chip test socket 140 to the PC motherboard.

Test adaptor board 150 provides electrical connection and packet interfaces such as serialization/deserialization between the memory module socket pins of the motherboard and the pins of DRAM chip 100 being tested. Additional memory chips 102 may be mounted to a surface of test adaptor board 150. Additional memory chips 102 could include DRAM chips, buffer chips, or an AMB chip when memory modules 36 are FB-DIMMs. Thus test adaptor board 150 mimics the same kind of memory module as memory modules 36 inserted into sockets on PC motherboard substrate 30.

Chip test socket 140 is a production-quality test socket requiring a low or zero insertion force and is able to accept many insertions, such as 100,000 or more insertions before the socket fails. Chip test socket 140 uses surface-mount technology in this embodiment, although traditional pins or other technologies such as ball-grid arrays could be substituted. Chip test socket 140 contains internal wiring to connect the power, ground, address, data, and control signals from DRAM chip 100 to socket pads 155 on the bottom of chip test socket 140. Socket pads 155 make electrical connections with matching pads on the top surface of the substrate of test adaptor board 150. This substrate is typically epoxy-glass or fiberglass, usually with multiple metal layers for wiring, such as with a typical printed-circuit board (PCB).

Production Test Systems

Figure 12:
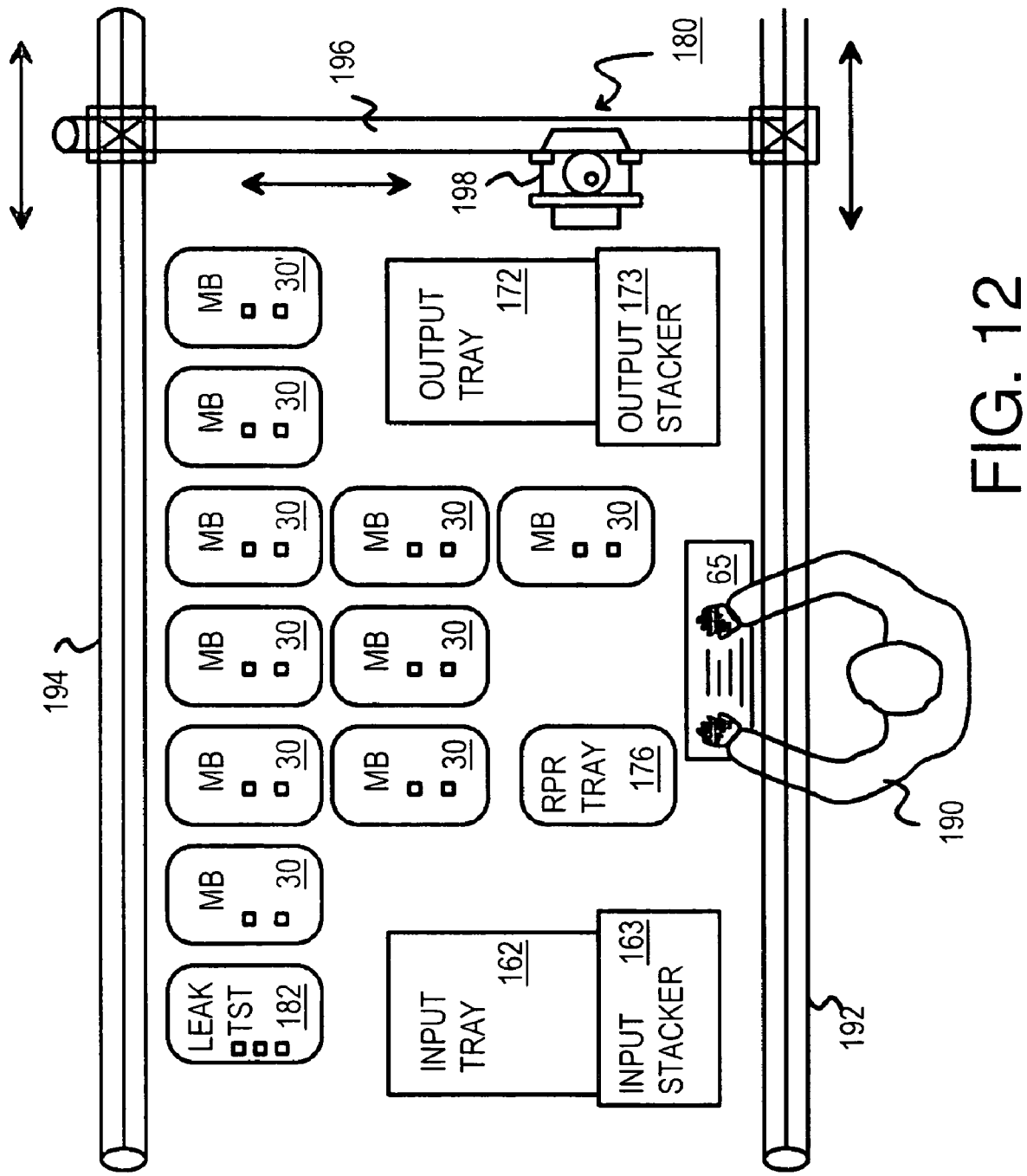
FIG. 12 is an overhead diagram looking down on a multi-motherboard test station with overhead rails for an x-y-z robotic handler.

FIG. 12 is an overhead diagram looking down on a multi-motherboard test station with overhead rails for an x-y-z robotic handler. See Co et al., "Automated Multi-PC-Motherboard Memory-Module Test System with Robotic Handler and In-Transit Visual Inspection", U.S. Pat. No. 6,415,397, which tests memory modules. Operator 190 can sit in front of the test station, controlling operation with a touch-screen or keyboard. Trays of untested memory chips can include a barcode that is scanned in to main system interface 65 by operator 190 before the tray is put into input stacker 163. Robotic handler 180 then picks untested memory chips that are moved over to input tray 162 by stacker 163. The chips are first inserted into leakage tester 182. Passing chips are then moved by robotic handler 180 to the test socket on the test adaptor board on the solder-side of one of motherboard substrates 30 for testing.

Chips that fail the motherboard or leakage test are placed on repair tray 176 by robotic handler 180. Chips passing the motherboard test are pulled from the test socket by robotic handler 180 and placed on output tray 172 and full trays are moved by stacker 173 to the front of the test station where operator 190 can remove them.

Each of the motherboards is mounted horizontally and upside-down and fits into a well in the frame of the test station. The test station has a surface at about bench-top level composed of the exposed solder sides of the motherboards in the wells in the frame. Robotic handler 180 rides on rails 192, 194 mounted above the level of the motherboards, such as above the head of a seated operator 190.

Fixed rails 192, 194 in the x direction allow movable y-rail 196 to travel in the x direction. Robot arm assembly 198 then travels in the y direction along y-rail 196 until robot arm assembly 198 is directly over the desired position, such as a test socket on a test adaptor board, or an input or output tray. An elevator arm on robot arm assembly 198 then moves up and down, pulling out (up) a chip or inserting a chip into (down) a test socket or tray. Robot arm assembly 198 can also rotate or spin the chip into the desired position.

Each of motherboard substrates 30 can have a memory-chip test-socket on a test adaptor board that connects to a module located at a middle-address, rather than at a high or low address. Then when the memory chip under test inserted into the test socket has a fault, the fault can be located by the test program running on that motherboard. The fault does not crash the motherboard. The test system host computer can ensure that memory chips under test are inserted into motherboards having a different size of known good memory modules to prevent interleaving.

Figure 13:
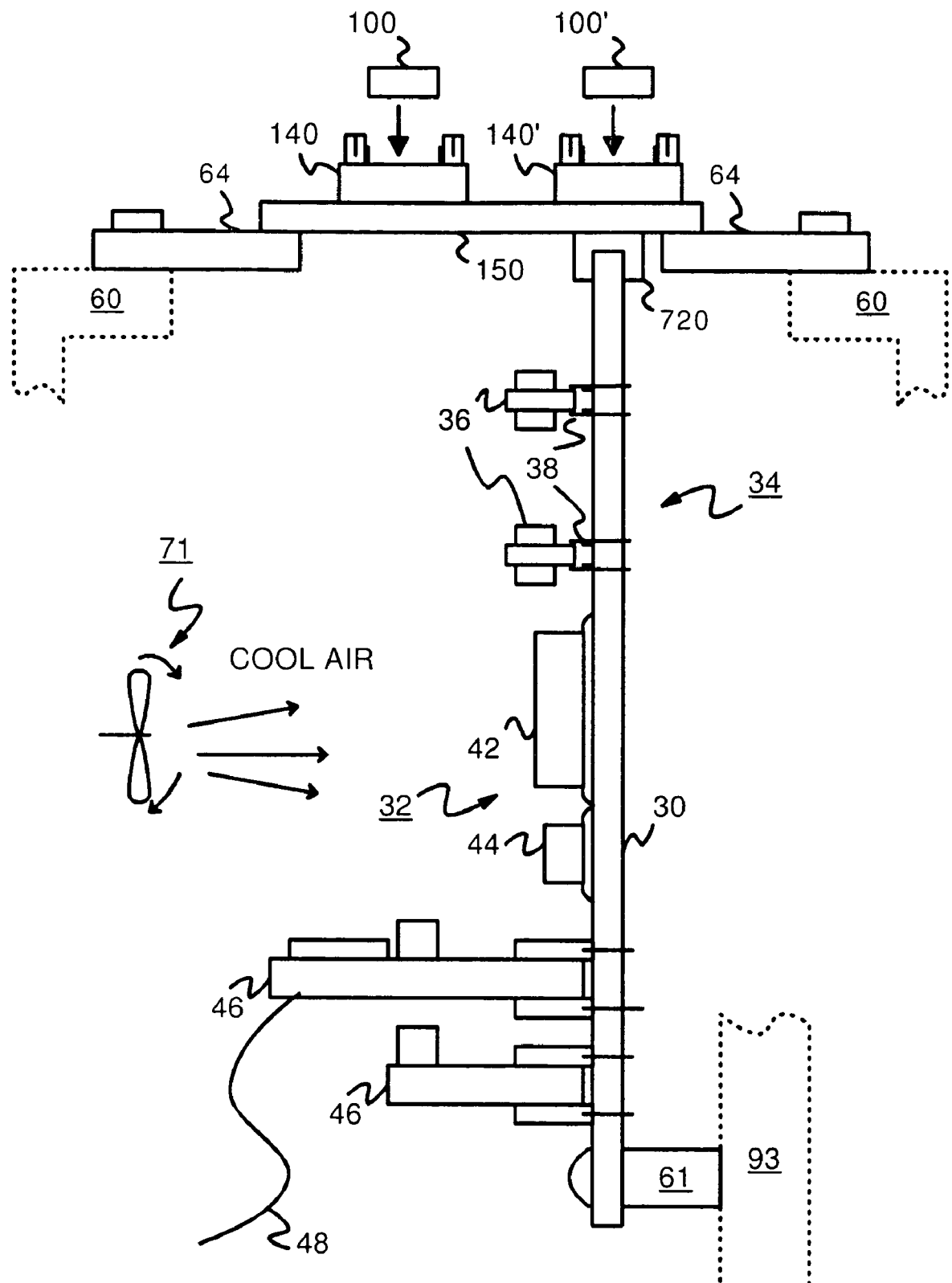
FIG. 13 shows a motherboard that is vertically mounted to a test adaptor board in a test system that tests memory chips at a middle portion of the address space.

FIG. 13 shows a motherboard that is vertically mounted to a test adaptor board in a test system that tests memory chips at a middle portion of the address space. A conventional PC motherboard is mounted vertically, rather than horizontally, within chassis 60. Motherboard substrate 30 is partially supported by test adaptor board 150 through edge socket 720, which allows motherboard substrate 30 to be mounted perpendicularly to test adaptor board 150 and to the horizontal bench surface of the test system. Additional support of motherboard substrate 30 can be provided by frame member 93, which can support motherboard substrate 30 by bolts through standoff or spacer 61. Additional supports (not shown) for motherboard substrate 30 could also be provided.

Test adaptor board 150 is mounted to upper or metal plate 64, which forms part of the horizontal or bench-top surface of the test system. Screws, bolts, or clamps (not shown) could be used to secure metal plate 64 to chassis 60. Test socket 140 is mounted to test adaptor board 150, and second test socket 140' may be used for testing two memory chips in parallel, doubling the test throughput. DRAM chips 100, 100' being tested are inserted into test sockets 140, 140'.

Edge socket 720 is mounted to the bottom surface of test adaptor board 150. Edge socket 720 can be a standard socket that mates contacts along an edge of motherboard substrate 30. Edge socket 720 and test adaptor board 150 provide electrical connection from test sockets 140, 140' to motherboard substrate 30.

Motherboard substrate 30 is modified to route DRAM bus signals to edge connectors along the edge of motherboard substrate 30 that plugs into edge socket 720. DRAM bus signals to a middle slot of SIMM/DIMM sockets 38 on motherboard substrate 30 are extended to the edge connectors to make electrical contact to test adaptor board 150 when the edge of motherboard substrate 30 is inserted into edge socket 720. Thus DRAM chips 100, 100' are used to store data for a middle address space.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38 and hold the lowest and highest portions of the address space.

SIMM/DIMM sockets 38 (hereinafter DIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory chip 100 into test socket 140 since cables 48 and expansion cards 46 are mounted below test adaptor board 150, while test socket 140 is mounted on the top surface of test adaptor board 150. Cables 48 and expansion cards 46 are kept out of the way inside chassis 60.

Test adaptor board 150 is a small circuit board that allows an automated handler, a person, or a robotic arm easy access to chip test socket 140 that is mounted on test adaptor board 150. Test socket 140 on one surface of test adaptor board 150 mates with pins or leads of DRAM chip 100, the memory-chip under test. The other surface of adaptor board 150 has edge socket 720 to make electrical contact to motherboard substrate 30.

None of DIMM sockets 38 have to be removed from the component side of the PC motherboard, since the DRAM bus is extended to the new edge contacts to make contact when plugged into edge socket 720.

Heated air may be blown above metal plate 64, past DRAM chips 100, 100'. Cooling fan 71 is provided in chassis 60 to cool motherboard substrate 30 and its components 42, 44 and expansion cards 46.

FIGS. 14A-B show testing a memory chip at middle addresses using an extender card. Test adaptor board 710 fits into extender card 724, which is inserted into a memory module socket on the motherboard substrate of the test system. Test adaptor board 710 and extender card 724 could be combined into one board or could be separate as shown. Test sockets 140 on one or both surfaces of test adaptor board 710 mate with pins or leads of DRAM chips, the memory-chips under test.

DRAM chips 718 are permanently soldered to test adaptor board 710, and together with the DRAM chips inserted into chip test sockets 140 form the middle portion of the memory space. Some of the DRAM chips may be mounted on the back side of test adaptor board 710, or a second bank of chips may be mounted on the back side.

Metal contact pads 721 on the lower edge of test adaptor board 710 are for inserting into test socket 722 on extender card 724. Metal wiring traces on extender card 724 connect signals from test socket 722 to the corresponding signals on lower-edge contact pads 725 so that all signals are passed through unchanged, as shown in FIG. 14B.

The direct pass-through of signals from lower-edge contact pads 725 to test socket 722 and contact pads 721 allows test adaptor board 710 to be tested just as if test adaptor board 710 were inserted directly into memory module socket 726 on PC motherboard 728. The increased height of test socket 722 above the surface of PC motherboard 728 makes testing easier since test socket 722 is more easily reached by an operator or handler machine.

During testing of test adaptor board 710 inserted into test socket 722, DRAM controller 738 on PC motherboard 728 receives data from a CPU or bus master and generates control signals to DRAM chips 718 and to chip test socket 140 on test adaptor board 710. Test generator 730 may generate test patterns or ECC bits and may signal an error.

Alternate Embodiments

Several other embodiments are contemplated by the inventor. For example, while a single defect 56 in the memory chip under test has been described, the test program could locate multiple defects in each memory chip under test. Defect types may also be identified by the locations of these defects, such as a column or a row of defects indicating a column or row failure. When all data that passes through a certain I/O pin of a DRAM chip on the memory chip under test fails, the failure may be a solder failure that could be fixed or reworked without replacing the DRAM chip. Thus identifying the type of defect may aid in rework operations.

Some motherboards may have multiple memory channels, and the slots may be arranged in some manner that requires interleaving. In that case, two test sockets 560 may be used, each with a memory chip under test, to two slots that are interleaved together, but not with any known good memory modules on the motherboard. The slots may be logical slots rather than physical plug-in slots, and are a concept that is useful in explaining memory configurations. Memory buses may be shared or separate.

Many kinds of DRAM chips and memory modules can be tested. Test adaptor board 150 can emulate modules using standard DRAM or newer EDO and synchronous DRAM. The system is ideally suited for testing the highest-speed memory chips, since capacitive loading is minimized. Other memories such as RAMBUS modules, DDR modules, and PC133 synchronous modules can be tested.

Various sizes of memory in the chip test socket, and form factors for memory chips and modules can be used with the invention. Different kinds and shapes of test adaptor boards can be substituted. The reverse-mounting of the test adaptor boards and the solder-side up arrangement of the test station allows a technician or operator to easily replace the test adaptor boards when necessary. Non-PC motherboards can also be used. The invention can be applied to any target system board. Multiple chip test sockets can be mounted on each test adaptor board, or multiple test adaptor boards may be mounted on a single motherboard, allowing multiple DRAM chips to be tested at the same time by the same motherboard acting as a tester.

Many combinations of margins could be tested for, such as Vcc, clock delay, and temperature. Electrically insulating material may be inserted between the test adaptor board and the motherboard, permitting a closer spacing.

A heating element could be added to the test adaptor board. The heating element could heat the memory chip in the test socket to a desired temperature for temperature margin tests. The amount of heating could be controlled by a heating voltage supplied by the controller card. A thermocouple could be included on the test adaptor board to measure the temperature near the test socket. This is useful regardless of the heating or cooling method used, such as when hot or cold air is blown onto the test socket.

Adaptor pins 52 connecting the test adaptor board to the motherboard could take on a variety of shapes and forms, and could even have a ball shape for very close spacings to the motherboard. The pins could be replaced by surface-mounting of the test adaptor board to the motherboard. A cable or wires could also be used in place of the pins. Pins from the test adaptor board that plug into the motherboard can have a ring (outward-going notch and joined to the pin), which prevents it from going beyond the top surface of the test adaptor board.

The adaptor pins could be soldered to or pressure-gripped to the test adaptor board and may be soldered to holes in the motherboard or inserted into pin receptacles that have been inserted into the holes.

In another alternate embodiment, small cups or pin receptacles are inserted into the holes on the motherboard where the DRAM socket was removed. The pins from the test adaptor board plug into these receptacles. In that embodiment, the pins are not soldered directly onto the motherboard. This allows for easy replacement of the motherboard or test adaptor board.

The test assembly can be flipped, rotated, turned or otherwise changed in orientation so that the test socket faces to the side or downwardly. The invention can operate in a variety of such orientations, and the description has used an upward orientation for convenience and clarity. When the orientation is altered interpretations of spatial descriptions such as "above" and "below" can be adjusted accordingly. Multiple test assemblies of motherboards and test adaptor boards can be mounted on a bigger chassis with multiple cavities.

The test adaptor board could also be mounted vertically to the motherboard or to the intervening adaptor board. The adaptor board could have an edge-connector socket that receives an edge connector on the test adaptor board. Thus the motherboard and the test adaptor board could be perpendicular to each other rather than parallel to each other.

Additional delay circuits can be added to the test adaptor board, allowing two or more signals to the memory chip under test to be skewed relative to each other. A sequencer could be added to the test adaptor board to automatically sequence Vcc and the clock skew once a test is started or power is applied when a new DRAM chip is inserted. Values can be specified in a variety of ways, both directly and indirectly. Margins rather than actual voltage or delay values can be specified, or even encoded.

While DRAM chips have been described, testing of other chips could be supported, such as SRAM, EEPROM, or even non-memory chips such as AMB's.

The term "pins" has been used to describe connectors for chips and board, but the actual pins may be leads, pads, solder balls, bent metal pads, or a variety of other connectors rather than just pointy metal pins. These are all considered to be pins.

The number of test sockets on the test adaptor boards could vary, and additional components could be added to the test adaptor boards. Different mounting mechanisms and electrical connections could be used. The motherboard may be substantially perpendicular to the test adaptor board by being at an angle such as from 60 to 120 degrees rather than exactly 90 degrees, or parallel to the test adaptor board.

A Yamaichi type connector could be used as the test socket, but a production-quality connector/socket is preferred due to the low insertion force required. A production quality connector/socket can take more insertions (greater than 100,000 times) than conventional sockets on motherboards (rated for 100 insertions).

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory chip to allow it to be warmed up by the hot air. Memory chips could also be preheated by blowing hot air onto chips waiting to be inserted and tested. The input tray could be heated to accomplish this.

One operator may be able to operate several test stations, depending on how quickly trays need to be inserted and removed. Multiple arms can be attached to robot arm assembly 98, allowing 2 or more memory chips to be picked up and moved at the same time. The test adaptor boards can be modified to have two or more test sockets, allowing two or more chips to be tested at the same time with the same motherboard. The motherboard can then report which of the 2 chips has failed to the main system interface.

A network controller card on the ISA or PCI bus that communicates with the main system interface or host can be adapted for other buses and is not limited to existing buses. The controller card can be replaced by a standard parallel or serial-port interface to the main system interface. FireWire, USB, or other emerging standards can be used for the interfaces. Many kinds of robotic arms and tracking systems can be employed, with different degrees of motion. Different grasping technologies can be used to hold the memory chips in the robotic arm. Multiple robotic arms that operate in tandem or independently can be used with the test station. For example, one arm can load chips into the motherboards, while a second arm unloads tested chips.

SPD-EEPROM 130 could be integrated into an Advanced Memory Buffer (AMB) or another buffer chip. SPD-EEPROM 130 may not be present on some types of memory modules. The invention could be applied to unbuffered memory modules, buffered memory modules, Fully-Buffered Dual-Inline Memory Module (FB-DIMM) memory modules, and other kinds of memory modules, including memory modules using future standards.

The invention may be combined with chip-level redundancy and repair that the DRAM manufacturer performs. Built-in-self-test (BIST) could be used for testing.

Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Muxes and switches could be added to allow for loop-back testing as well as standard operation. Future memory module standards and extensions of the memory module standard could benefit from the invention.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A motherboard-based tester that locates defects in memory chips without crashing comprising:

a test adaptor board, having a test socket for receiving a memory chip under test for testing by the motherboard-based tester, the test adaptor board for electrically connecting the memory chip under test inserted into the test socket to a motherboard attached to the test adaptor board, the motherboard using the memory chip under test inserted into the test socket as a middle portion of a main memory of the motherboard;

additional memory chips mounted on the test adaptor board, wherein the additional memory chips and the memory chip under test inserted into the test socket together form an emulated memory-module memory;

wherein the motherboard is a main board for a computer using memory modules as the main memory;

a first module slot on the motherboard, the first module slot connecting to a first memory module socket on a component side of the motherboard and having a first known good memory module inserted;

a second module slot connecting to a location of a second memory module socket on the component side of the motherboard and also connecting to the test adaptor board, wherein the memory chip under test inserted into the test socket on the test adaptor board is accessed through the second module slot;

a third module slot on the motherboard, the third module slot connecting to a third memory module socket on the component side of the motherboard and having a second known good memory module inserted;

a copy of a basic input-output system (BIOS) stored in the second known good memory module;

an operating system image stored in the first known good memory module;

a test program stored in the first known good memory module, wherein the test program is executed by a processor on the motherboard that causes memory locations in the memory chip under test to be written and read without crashing the motherboard; and a defect location within the memory chip under test identified by the test program executing on the processor, the defect location being reported to a user, whereby the defect location is identified by the test program without crashing the motherboard by the test program that is not loaded into the memory chip under test.

2. The motherboard-based tester of claim 1 wherein the middle portion of the main memory of the motherboard is between memory addresses that access the first known good memory module and the second known good memory module, wherein the memory chip under test is accessed by memory addresses between memory addresses that access the first known good memory module and memory addresses that access the second known good memory module.

3. The motherboard-based tester of claim 2 wherein the BIOS is disabled from performing a memory sizing test during booting;

further comprising:

a programmable delay generator, mounted to the test adaptor board, for delaying a signal to the memory chip under test in the test socket in response to the test program executing on the motherboard, whereby margin timing testing is supported by the test adaptor board.

4. The motherboard-based tester of claim 2 further comprising:

a serial-presence-detect electrically-erasable programmable read-only memory (SPD-EEPROM) mounted to the test adaptor board, the SPD-EEPROM storing a configuration for the emulated memory-module memory emulated by the test adaptor board, the configuration including a memory size and a speed parameter, wherein the BIOS reads serial-presence-detect memories on the first known good memory module, on the second known good memory module, and the SPD-EEPROM on the test adaptor board to determine a memory configuration;

wherein the test adaptor board is configured to be accessed by middle addresses that do not overlap the copy of the BIOS, the operating system image, or the test program.

5. The motherboard-based tester of claim 2 wherein the test adaptor board with the memory chip under test has a memory size that differs from a memory size of the first and second known good memory modules;

wherein interleaving of the memory chip under test is prevented by the memory size being different than memory sizes of the first and second known good memory modules.

6. The motherboard-based tester of claim 2 wherein the first memory module socket and the third memory module socket are mounted to the component side of the motherboard, the component side having integrated circuits mounted thereon and expansion sockets mounted thereon for expansion boards;

wherein the test adaptor board is mounted to a solder side of the motherboard, the solder side being opposite to the component side.

7. The motherboard-based tester of claim 6 further comprising:

an Advanced Memory Buffer (AMB) mounted to the test adaptor board, the AMB for receiving serial packets sent by the motherboard, and for generating parallel address and data signals to the additional memory chips and to the memory chip under test for testing in the test socket, whereby serial packets from the motherboard are de-serialized by the AMB on the test adaptor board.

8. The motherboard-based tester of claim 6 further comprising:

an intervening adaptor board fixedly attached to the motherboard by adaptor pins;

a first connector mounted to the intervening adaptor board and electrically connected to the adaptor pins by wiring traces on the intervening adaptor board;

a second connector mounted to the test adaptor board, for mating with the first connector, wherein the test adaptor board is removable from the motherboard by disconnecting the second connector from the first connector on the intervening adaptor board that is fixedly attached to the motherboard.

9. The motherboard-based tester of claim 2 wherein the motherboard is in a plurality of motherboards, each motherboard having a test adaptor board and a test socket for testing a memory chip under test without crashing;

further comprising:

a diagnostic system interface, coupled to the plurality of motherboards, for commanding the motherboard to test the memory chip under test inserted into the test socket and for receiving test results from the motherboard, and a robotic arm, responsive to commands from the diagnostic system interface, for inserting memory chips into the test sockets for use as the memory chip under test, whereby the memory chips inserted into the test sockets on the test adaptor boards are tested by motherboards without crashing.

10. The motherboard-based tester of claim 1 wherein the test adaptor board is a module extender card that is inserted into the second memory module socket on the component side of the motherboard.

11. A crash-resistant memory-chip tester comprising:

a robotic device that moves memory chips from an input stack of untested memory chips to an output stack of tested memory chips;

a host computer for controlling the robotic device;

a plurality of test stations for testing memory chips that are loaded and unloaded by the robotic device, each test station comprising:

a test adaptor board;

a test socket mounted on the test adaptor board, the test socket for receiving a memory chip inserted by the robotic device for use as a memory chip under test;

a motherboard for a personal computer, the motherboard executing a test program in response to commands from the host computer, the test program testing the memory chip inserted into the test socket;

a first module slot on the motherboard, the first module slot connecting to a first memory module socket on a component side of the motherboard and having a first known good memory module inserted;

a second module slot connecting to a location of a removed second memory module socket on the component side of the motherboard and also connecting to the test adaptor board, wherein the memory chip under test inserted into the test socket on the test adaptor board is accessed through the second module slot;

a third module slot on the motherboard, the third module slot connecting to a third memory module socket on the component side of the motherboard and having a second known good memory module inserted;

a copy of a basic input-output system (BIOS) stored in the second known good memory module;

an operating system image stored in the first known good memory module; and wherein the test program is stored in the first known good memory module, wherein the test program executed by the motherboard causes memory locations in the memory chip under test to be written and read without crashing the motherboard, whereby the memory chip under test is tested without crashing the motherboard using the test program that is not loaded into the memory chip under test.

12. The crash-resistant memory-chip tester of claim 11 wherein the test adaptor board further comprises:

additional memory chips mounted on the test adaptor board, wherein the additional memory chips and the memory chip under test inserted into the test socket together form an emulated memory-module memory;

wherein a middle portion of a main memory of the motherboard is between memory addresses that access the first known good memory module and the second known good memory module, wherein the memory chip under test is accessed by memory addresses between memory addresses that access the first known good memory module and memory addresses that access the second known good memory module.

13. The crash-resistant memory-chip tester of claim 12 wherein the test adaptor board with the memory chip under test has a memory size that differs from a memory size of the first and second known good memory modules;

wherein interleaving of the memory chip under test is prevented by the memory size being different than memory sizes of the first and second known good memory modules.

14. The crash-resistant memory-chip tester of claim 12 wherein each test adaptor board further comprises:
   a second test socket mounted on the test adaptor board, the second test socket for receiving a second memory chip under test inserted by the robotic device,
   wherein the motherboard tests both the memory chip under test and the second memory chip under test,
   whereby two memory modules are tested by each motherboard.

15. The crash-resistant memory-chip tester of claim 12 further comprising:
   an intervening adaptor board fixedly attached to the motherboard by adaptor pins;
   a first connector mounted to the intervening adaptor board and electrically connected to the adaptor pins by wiring traces on the intervening adaptor board;
   a second connector mounted to the test adaptor board, for mating with the first connector,
   whereby the test adaptor board is removable from the motherboard by disconnecting the second connector from the first connector on the intervening adaptor board that is fixedly attached to the motherboard.

16. A reliable multiple-motherboard memory tester comprising:
   main system means for controlling testing of memory chips on multiple motherboards;
   a plurality of test station means for testing memory chips, each test station means comprising:
   test socket means for receiving a memory chip under test for testing;
   motherboard means, controlled by the main system means, for executing a test program to test a memory chip under test inserted into the test socket means; and
   test adaptor board means, mounted to the motherboard means, for electrically connecting the test socket means to a memory bus means on the motherboard means;
   additional memory chips mounted on the test adaptor board means, wherein the additional memory chips and the memory chip under test form an emulated memory-module memory;
   first module slot means for connecting to a first memory module socket on the motherboard means, and for receiving a first known good memory module inserted;
   second module slot means for connecting to a location of a second memory module socket on the motherboard means, and for connecting to the test adaptor board means, wherein the memory chip under test inserted into the test socket means on the test adaptor board means is accessed through the second module slot means;
   third module slot means for connecting to a third memory module socket on the motherboard means, and for receiving a second known good memory module inserted;
   a copy of a basic input-output system (BIOS) stored in the second known good memory module;
   an operating system image stored in the first known good memory module;
   wherein the test program is stored in the first known good memory module, wherein the test program executed by the motherboard means causes memory locations in the memory chip under test to be written and read without crashing the motherboard means,
   wherein the reliable multiple-motherboard memory tester has a plurality of the motherboard means, each motherboard means having an attached test adaptor board means with a test socket means, each motherboard means for executing the test program on a different memory chip under test in parallel with other motherboard means;
   whereby the memory chip under test is tested without crashing the motherboard means using the test program that is not loaded into the memory chip under test.

17. The reliable multiple-motherboard memory tester of claim 16 further comprising:
   Advanced Memory Buffer (AMB) means, mounted to the test adaptor board means, for receiving serial packets sent by the motherboard means, and for generating parallel address and data signals to the additional memory chips and to the memory chip under test for testing in the test socket means;
   a defect location within the memory chip under test identified by the test program executing on the motherboard means, the defect location being reported to the main system means,
   whereby the defect location is identified by the test program without crashing the motherboard means by the test program that is not loaded into the memory chip under test.

18. The reliable multiple-motherboard memory tester of claim 16 wherein a middle portion of a main memory of the motherboard means is between memory addresses that access the first known good memory module and the second known good memory module,
   wherein the memory chip under test is accessed by memory addresses between memory addresses that access the first known good memory module and memory addresses that access the second known good memory module.

19. The reliable multiple-motherboard memory tester of claim 18 further comprising:
   edge socket means, attached to the test adaptor board means, for connecting the test adaptor board means to an edge of the motherboard means;
   wherein the test adaptor board means is perpendicular to the motherboard means;
   wherein the test adaptor board means with the memory chip under test inserted has a memory size that differs from a memory size of the first and second known good memory modules;
   wherein interleaving of the memory chip under test is prevented by the memory size being different than memory sizes of the first and second known good memory modules.

20. The reliable multiple-motherboard memory tester of claim 16 further comprising:
   robotic means, controlled by the main system means, for grasping a memory chip and inserting the memory chip into the test socket means, the robotic means also for grasping and removing the memory chip from the test socket means after completion of the test program, and moving the memory chip to an output means for storing tested memory chips when the motherboard means indicates to the main system means that the memory chip has passed the test program,
   whereby the memory chips are moved by the robotic means.

* * * * *